United States Patent [19]

Reymond

[11] Patent Number: 5,517,532

[45] Date of Patent: May 14, 1996

[54] STANDING SINE WAVE CLOCK BUS FOR CLOCK DISTRIBUTION SYSTEMS

[75] Inventor: Welles Reymond, Waterbury, Conn.

[73] Assignee: General DataComm, Inc., Middlebury, Conn.

[21] Appl. No.: 143,442

[22] Filed: Oct. 26, 1993

[51] Int. Cl.$^6$ ......................................................... H04L 7/00
[52] U.S. Cl. ........................... 375/354; 327/141; 327/144; 370/85.1; 370/100.1
[58] Field of Search ...................................... 375/106, 110, 375/111, 113, 200, 203; 370/100.1, 85.1, 94.3; 364/721, 200; 327/141, 144, 145

[56] References Cited

U.S. PATENT DOCUMENTS

| | | | |
|---|---|---|---|
| 5,060,139 | 10/1991 | Theus ........................................ | 364/200 |
| 5,105,340 | 4/1992 | Lawrence ................................. | 361/414 |
| 5,157,277 | 10/1992 | Tran et al. ............................... | 307/269 |
| 5,255,375 | 10/1993 | Crook et al. ............................. | 395/295 |
| 5,281,861 | 1/1994 | Tran et al. ............................... | 307/269 |

OTHER PUBLICATIONS

Kihara, "Performance Aspects of Reference Clock Distribution for Evolving Digital Networks", IEEE Comm. Mag. vol. 27, No. 4, Apr. 1989 pp. 24–36.

Hagelauer et al. "Investigations and Measurements of Dynamic Performance of High Speed ADCs", Instrumentation and Measurement Technology Conf. 1992.

Primary Examiner—Stephen Chin
Assistant Examiner—Bryan Webster
Attorney, Agent, or Firm—David P. Gordon

[57] ABSTRACT

A clock phase and frequency distribution system is disclosed which uses a standing sine wave and provides substantially simultaneous significant crossing instances everywhere in the system while using low power and not requiring bus termination or precise control of transmission path characteristics ($Z_0$). The system is particularly advantageous in high frequency applications such as digital, linear (non-branched), backplane applications, but is also applicable to other topographies such as stars, rings, and meshes. The system includes a sine wave generating and driving circuit, a clock bus, and clock receivers. The clock receivers present a high impedance interface to the clock bus. The basic design considerations and parameters which limit and define performance include the maximum propagation delay between any two points in the system, the total low frequency capacitance of the system, and the Q of the system which must be high at the frequency of the standing wave in order to satisfy low power and simultaneity objectives. To overcome system length limitations, embodiments utilizing master and slaves are provided, where phase feedback is provided to the slaves. Multifrequency systems are also provided.

42 Claims, 10 Drawing Sheets

STANDING SINE WAVE CLOCK BUS FOR CLOCK DISTRIBUTION SYSTEMS

BACKGROUND OF THE INVENTION

This invention relates generally to the clocking of synchronous digital systems. More particularly, this invention relates to clock distribution systems for synchronous digital data transport systems such as backplanes and integrated circuits where clock skew is an important performance parameter.

In many synchronous digital bus transport systems, three types of signals are often provided, including a clock signal at some frequency $F_1$, a synchronization signal (sync pulse) which provides frame references, and one or more data signals. Sometimes, only the clock and data signals are used, where the data signals include sync, data, and address information. In these systems, clock crossing information, i.e., clock timing, is used by the data sources to change the data and by the data sinks to sample the state of the data. In other words, the data is sampled and changed at a time related to an instant when the clock signal crosses a predetermined threshold. The waveform of the data in such systems is not of great importance as long as the data signal is properly above or below the data signal discrimination level for a sufficient time around the sampling instant. On the other hand, the ability of all data sinks and data sources to accurately and uniformly obtain clock crossing information is of extreme importance. The clock crossing information is typically dependent, at least in part, on the clock waveform, the discrimination level accuracy, the intrinsic delay between any two points in the system, and the relative location of the clock source or sink on the bus, where the intrinsic delay is the theoretical minimum propagation time for information between two points.

In the past, for simplicity and uniformity, designers of digital system buses have typically used square wave clocks using the same digital drivers and receivers used in transmitting data. Terminated and unterminated (open) buses have been designed. An illustrative representation of a prior art backplane system is shown in FIG. 1, where a common card 12 broadcasts clock and sync information over buses 14 and 16 to a plurality of Q–1 access nodes which are typically equally spaced over bus length L. The access nodes other than common card 12 only receive the clock and sync information. M data buses 18a, 18b, . . . , 18m, are also shown, with the Q–1 access nodes being able to transmit or receive data onto the buses. Using the timing information broadcast by common card 12, the data sinks and sources 20 can exchange data on the data buses. Of course, if desired, the data buses can be unidirectional rather than bidirectional as shown, and the buses can be either nonterminating or terminating.

The idealized timing diagram of FIG. 2 illustratively corresponds with the prior art backplane system of FIG. 1. The clock signal of FIG. 2 as shown is idealized in that it is a perfect square wave with sharp edges and a fifty percent duty cycle. Such a perfect clock signal allows perfect, unambiguous extraction of the crossing information. The data sources use the crossing information to put data onto data lines 18 at the crossing instant, while the data sinks use the crossing information to take data off of data lines 18 after the crossing instant, as indicated. Implicit in the idealized timing diagram of FIG. 2 is that the discrimination or threshold levels for the clock, sync and data signals are between the [0] and [1] amplitudes shown.

As implied above, the clock signals of the prior art are never the perfect square waves which are represented. To make perfect square waves, an infinite bandwidth, with the fundamental frequency and all its harmonics, would be required. Thus, the idealized waveform does not take into account the reality of relatively unknown source impedances of the driver, the typically lumpy characteristic impedance of the bus transmission line, the total electrical length of the bus, etc. These realities, unless carefully addressed, cause serious waveform distortion as suggested by FIG. 3 where a clock edge is shown with a transient which causes the double crossing of the discrimination level. With such distortions, clock glitches can result, as shown. While the double crossing is due to bus reflections, it is useful to think of the distortions as intersymbol interference, undesirable phase displacement, and gain or loss of the harmonics of the clock fundamental frequency. These harmonics are in principle not required, since the clock signal only needs to indicate a threshold crossing event (i.e., a timing event), and not true "information" (i.e., data).

One of the manners of addressing the impedance problems which can cause distortion and clock glitches is to terminate both ends of the bus with an impedance as close as possible to the characteristic impedance of the bus, thereby minimizing reflections. The IEEE "Futurebus" standard utilizes this approach, by transmitting a large number of lined-up harmonics. In practice, termination to prevent reflections has a number of shortcomings and problems. A first shortcoming is that a significant amount of power is wasted. A second shortcoming is that in synchronous bus systems which are terminated, the clock transition is propagated along the bus at a limited velocity, thereby causing a delay between any two nodes on the bus. In other words, clock skew is introduced. This delay or clock skew is of significant consequence as it places an upper bound on the clock rate of a synchronous system depending upon the electrical length of the system. Another problem with using a terminated bus is that the impedance of the bus must be matched at the termination. However, the effective impedance of the bus, or any particular portion thereof, is dependent on the type and density of equipment coupled to the nodes. Therefore, in many systems, the impedance is uncertain. In fact, in Futurebus, a great deal of care and expense is expended in controlling the bus impedance, controlling access node loading, terminating the bus accurately, and keeping power within reasonable bounds.

SUMMARY OF THE INVENTION

It is therefore an object of the invention to provide clock distribution in a synchronous system of nontrivial intrinsic delay in which the significant clock crossing instances are substantially simultaneous everywhere in the system.

It is another object of the invention to provide a clock distribution system where substantially the same amplitude of clock signal is simultaneously provided everywhere in the system.

It is a further object of the invention to provide a high frequency clock signal in such a manner that precise parameter control and engineering are not required for the system to properly function.

An additional object of the invention is to provide a clock signal for such systems which is extremely low in power consumption.

Another object of the invention is to provide a clock signal for such systems which is narrow band and which substantially reduces cross-talk among the clock and data signals.

A further object of the invention is to provide a clock signal for such systems, where the clock bus is unterminated and can be used in other than linear topographies.

Yet an additional object of the invention is to provide means for generating the substantially distortion-free, low power, high speed clock signal of the invention, and receiver means which optimize the advantages and performance of the system.

Even a further object of the invention is to provide a high speed clock distribution system which is simply generated and substantially distortion-free, and which is advantageous for use in a digital backplane or like synchronous data transport systems.

A clock signal for a clock distribution system (e.g., a digital backplane) which accomplishes the above objects of the invention is a properly implemented standing sine wave clock signal of a desired frequency which is induced by a clock generator on a clock bus.

Theoretically, in a generalized finite, linear, passive, and lossless circuit consisting only of segments of lossless transmission lines and nodal capacitances (and no resistors), when a sine wave signal of frequency $F_1$ is induced at one node, only a sine wave of frequency $F_1$ will exist at all the other nodes, and the absolute crossing time of the signal seen at the nodes will be the same (i.e., simultaneous). The absolute crossing time seen at all nodes will be the same because there is no real (as opposed to imaginary) power being transported between nodes, as there is no power dissipation (i.e., loss) in the system. While the crossing time will be the same at all nodes, unless other constraints are provided in the system, the relative sense of the crossings may be positive or negative, the amplitudes may vary from zero to infinity, the impedance at $F_1$ seen at a node may take on values from zero to $\pm j$(infinity), and the time required to establish a steady state standing wave could be very long. Thus, it is desirable in a useful and practically realizable system, to appropriately control loss (e.g., as little loss as possible), as well as to simultaneously limit the size of the system with respect to $F_1$ (i.e., limit the electrical length). This should be done so that the absolute phase (as well as crossing time) will be the same at every node, and that the impedance and amplitude at the nodes will be practically known and bounded. As an examplary and illustrative case where the topography is linear (such as in a common digital backplane) and where the transmission line segments have approximately the same characteristic impedance ($Z_o$) of for example 75Ω±20%, it can be shown that if the clock injection node is less than 1/16 of a wave length of $F_1$ away from both ends of the system, then the amplitude difference between any two nodes in the system will be less than 10%. In addition, the apparent capacitance seen at any node will not exceed the total low frequency capacitance of the system by more than 10%. From this it will be recognized that there may be an advantage, in linear systems, in putting the clock source near the middle of the system. For other than linear topographies, or where the characteristic impedance of the transmission line segments are not substantially the same, such a simple constraint for amplitude and impedance control is not realizable. However, it will be appreciated that control of these parameters and the optimum location of the clock source in the system is still related to the electrical size of the system which can be determined by use of computer simulations or by direct application of transmission line equations.

In systems utilizing a standing sine wave clock signal approach, the clock receivers should present a high real impedance at frequency $F_1$ to the bus in order to avoid power dissipation (i.e., loss). The high real impedance is readily achieved using standard CMOS technology.

The frequency of the desired sine wave clock is typically set according to system requirements. However, upper bounds on the frequency are effectively set based on the propagation delay ($t_L$) at $F_1$ from one end of the system to the other, and the total low frequency capacitance of the bus. The propagation delay is related to the character of the transmission line segments of which the system is composed and is significantly increased by capacitive loading at the nodes (i.e., nodal occupancy).

According to other aspects of the invention, the clock bus may assume different topographies, such as a ring (loop), a star or a mesh with one or more common nodes, etc. In addition, master/slave subsystems may be utilized to enlarge the effective size of the system. Further, if desired, a multifrequency system can be utilized with standing sine waves of different frequencies simultaneously present on the same bus.

According to yet additional aspects of the invention, various sine wave generator and receiver circuits for the sine wave distribution system are disclosed. Typically, the receivers take the general form of a slicer/comparator with low input capacitance. Preferably the receivers are high speed, low delay receivers. Different receivers, including receivers with bias correcting feedback, and receivers which use a substantially DC artifact component of the clock signal are provided.

Additional objects and advantages of the invention will become apparent to those skilled in the art upon reference to the detailed description taken in conjunction with the provided figures.

DETAILED DESCRIPTION OF THE PREFERRED EMBODIMENT

Figure 1:
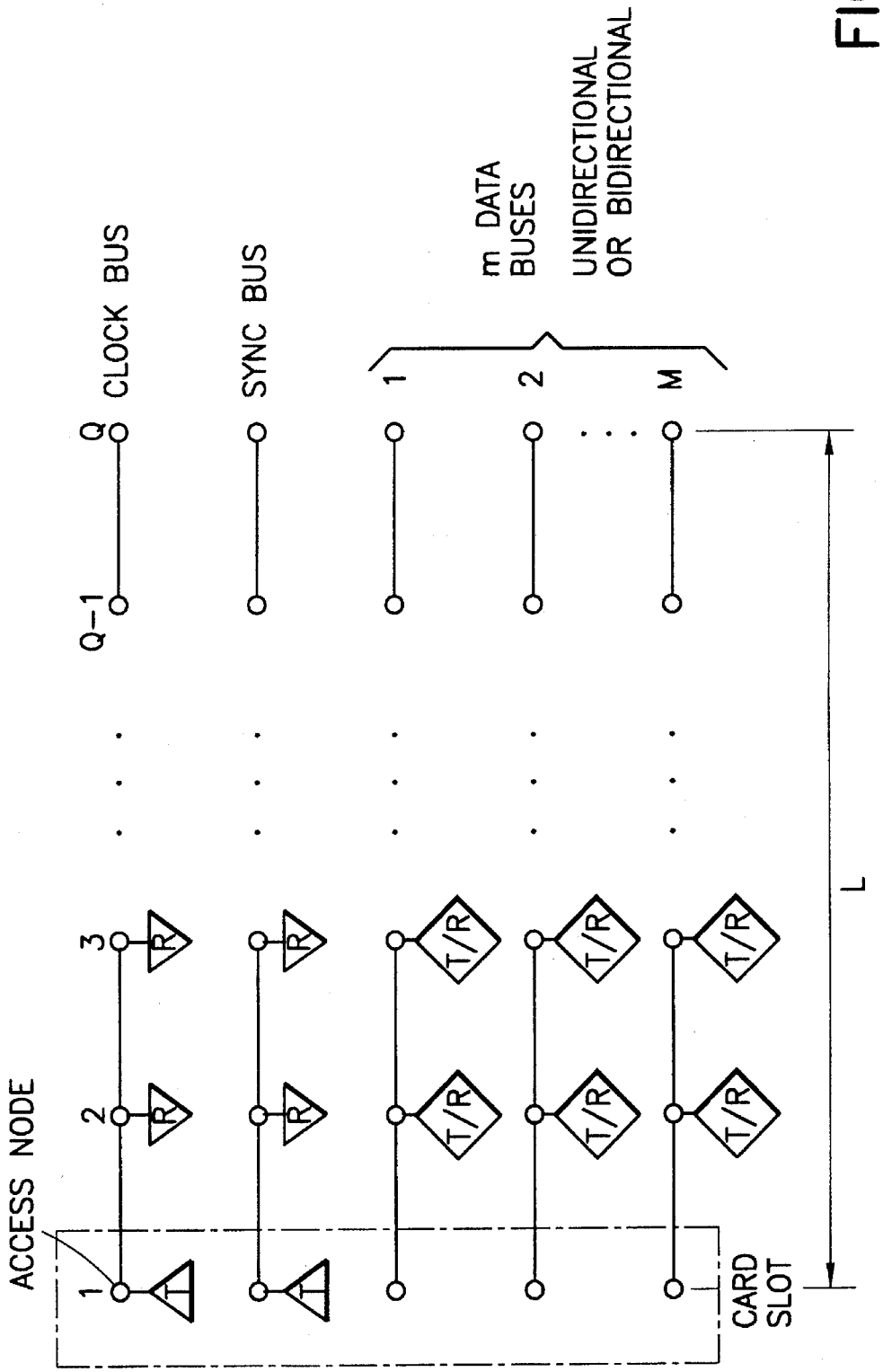
FIG. 1 is a schematic of a typical prior art backplane bus system.
Figure 2:
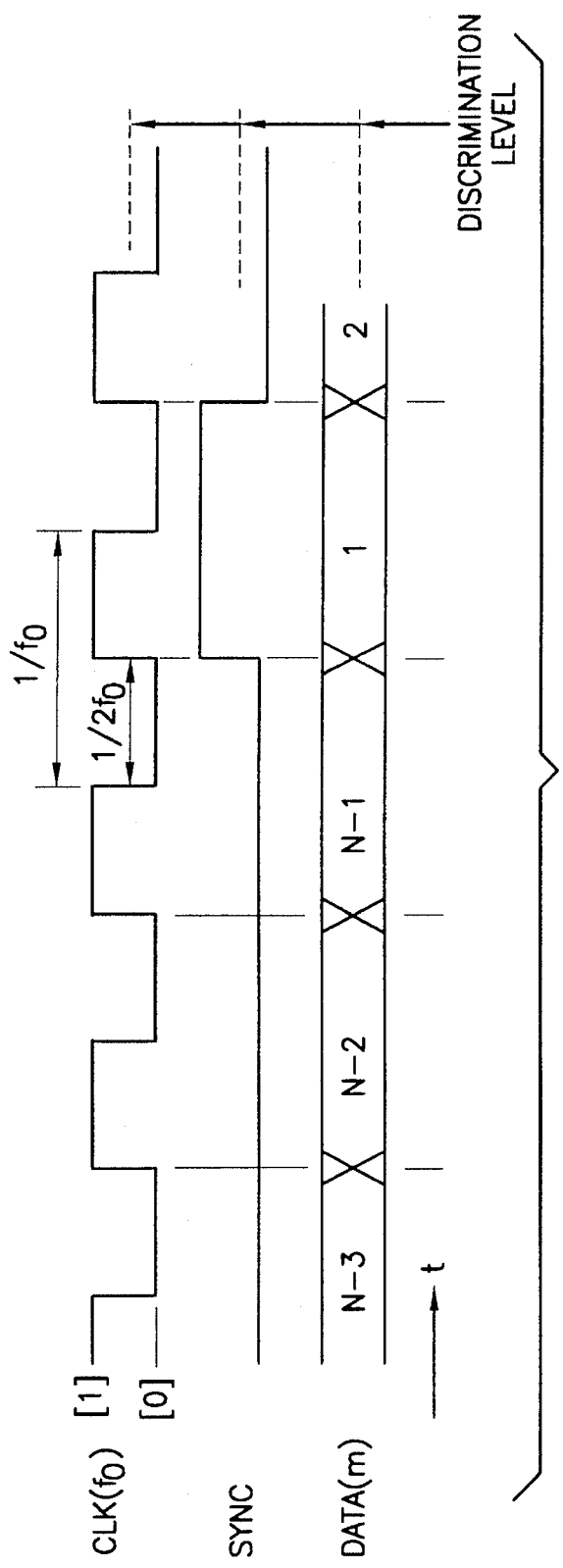
FIG. 2 is a prior art idealized timing diagram for a clock signal, a sync signal, and data signals corresponding to the prior art backplane synchronous system of FIG. 1.
Figure 3:
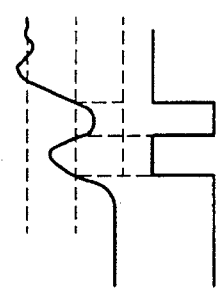
FIG. 3 is a timing diagram showing a clock edge detail of the clock in FIG. 2 in non-idealized form, and a clock glitch which results from reflections.
Figure 4A:
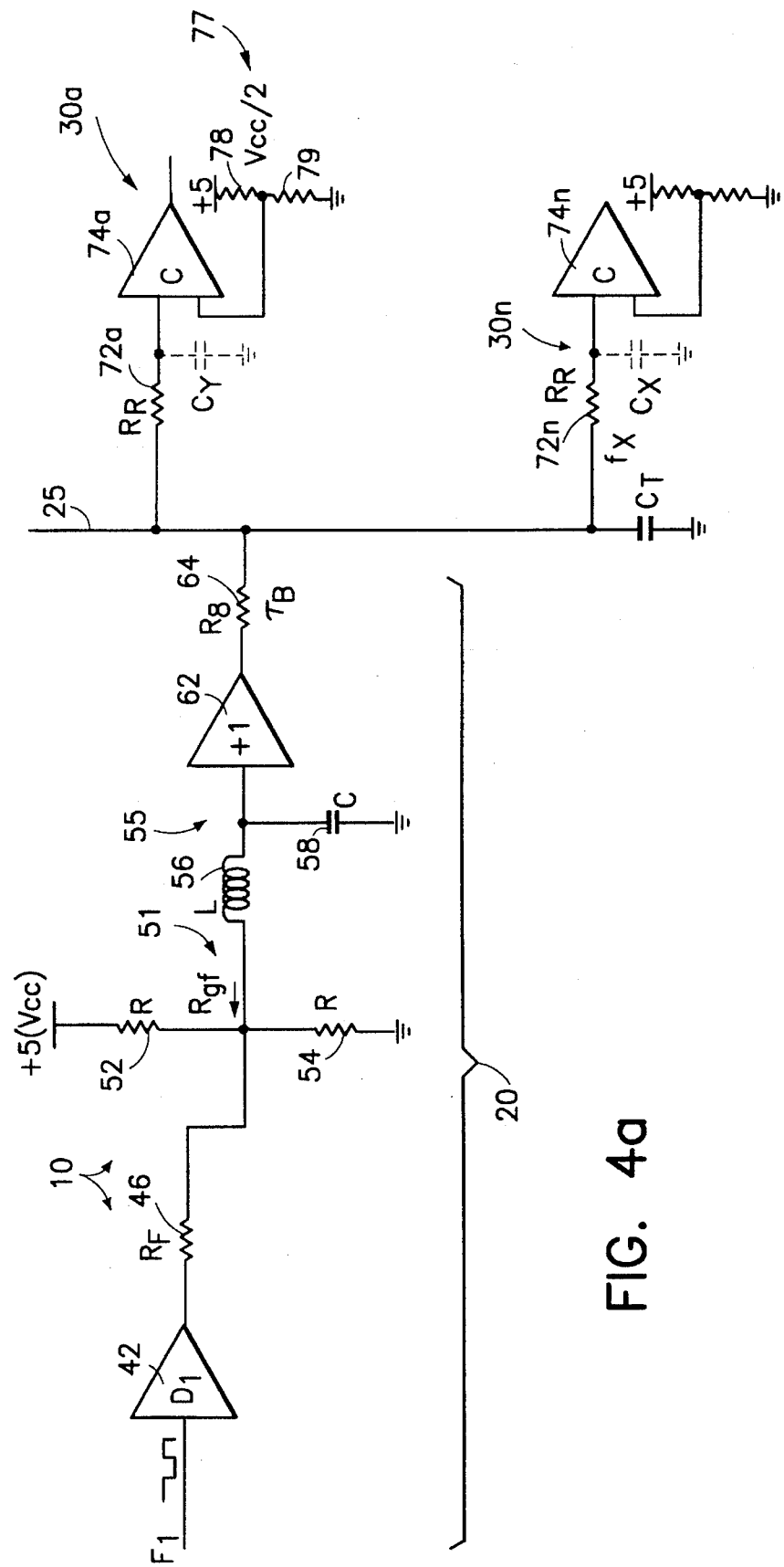
FIG. 4a is a circuit diagram of a preferred system of the invention including a sine wave clock generator, high impedance clock receivers, and the sin wave bus.

Turning to FIG. 4a, a preferred circuit diagram of the system 10 of the invention is seen, with a sine wave clock generator 20, the sine wave clock bus 25 to which the sine wave clock generator 20 is coupled, and a plurality of clock receivers 30a, . . . , 30n also coupled to the sine wave clock bus 25. The preferred embodiment is specifically arranged for practical implementation in a system that employs generic five volt ($V_{cc}$) CMOS logic and technology, although adaptations of the principles described herein may be applied to other circumstances. With CMOS logic and technology, the general approach is to utilize an available CMOS logic level square wave signal at the desired clock frequency $F_1$. This square wave signal is passed through a low pass filter such that the harmonics of the originating square wave are sufficiently eliminated, and a sine wave of sufficiently low distortion is produced which has an amplitude and reference level compatible with CMOS clock receiver comparator technology. This approach generally implies an amplitude less than $V_{cc}$ volts peak to peak with a reference level of $V_{cc}/2$.

Returning to FIG. 4a, the sine wave clock generator 20 as shown is simply derived from a square wave signal at frequency $F_1$ (although it could also be derived from a combination of the square wave signal at frequency $F_1$ in conjunction with appropriate amplitudes and phases of one or more harmonics such as the third and fifth harmonics of $F_1$ to provide cancellation of these harmonics). In a typical application, e.g., for multiplexer systems, $F_1$ might be set at 4.096 MHz. The square wave signal is fed to CMOS driver 42. Coupled to the output of the driver 42 is a resistor 46. The value chosen for resistor 46 should take into account the output "on" impedance of driver 42 unless it is insignificantly small compared to the desired value of resistor 46, which is usually the case. The signal provided by resistor 46 is fed to a voltage divider 51 (between $V_{cc}$ and ground) comprised of resistors 52 and 54. With resistors 52 and 54 of equal value, the reference DC voltage of the ultimate sine wave output of the filter will be $V_{cc}/2$ (e.g., about 2.5V) as desired. The network comprised of resistors 46, 52, and 54 also provides two other functions. First, the amplitude of the sine wave is set by the attenuation coefficient $((R_{52}\|R_{54})/[R_{46}+R_{52\|R54}]$. Second, the Q setting of the filter by the effective Thevinen equivalent generates a resistance $R_{gf}$ which is effectively the parallel combination of resistors 46, 52, and 54. This centered and attenuated signal is then fed through a portion of the low pass filter 55 which is comprised of an inductor 56, and capacitor 58. The low pass filter 55 is preferably provided with the following parameters: Q=1 and $f_0$=F1, where $f_0$ is the cut-off frequency of the filter and $f_0 = 1/2\pi\sqrt{C_{58}L_{56}}$, and where Q is the ratio of the magnitude of either the impedance of $C_{58}$ to $L_{56}$ to $R_{gf}$. With these parameters, the low pass filter has an effective absolute gain of one at $F_1$, with respect to the equivalent Thevinen generator voltage, and the gain is essentially −12 db per octave for components above $F_1$. This filtering suppresses the unwanted harmonics of F1 to produce an appropriate low distortion sine wave.

The output of the low pass filter 55 is fed to a linear buffer 62 having a gain of one. The buffer 62 is preferably coupled to the sine wave clock bus 25 by a resistor 64. In order for the clock system to have substantial simultaneity as well as the other desirable characteristics previously described, the clock bus 25 should be capacitive and should have low loss at frequency $F_1$ from the point of view of the generating node. With low loss, real power is not transported between nodes; i.e., the system has a high Q at frequency $F_1$. The low loss at frequency $F_1$ does not mean, however, that the generator itself cannot present loss to the system at any frequency, including $F_1$. Further, it will be appreciated that the system can have significant loss (i.e., low Q) at frequencies other than $F_1$. In fact, significant loss at other frequencies is desirable in practical systems. For example, in practical systems, unwanted signals which are typically of frequencies higher than $F_1$ may be injected into the clock circuit by cross-talk and other mechanisms, and it is desirable that these unwanted signals be dissipated. Resistor 64, and as described hereinafter, resistor 72 contribute usefully to this damping (dissipation) process. Thus, in accordance with a first embodiment of the invention where it is desirable to present sine waves of only a single frequency to the sine wave clock bus 25, the signal applied at the output of the sine wave generator 20 is a sine wave at frequency F1, which in the illustrative embodiment is equal to 4.096 MHz.

Also coupled to the bus 25 are one or more clock receivers 30. The clock receivers are generally comprised of a resistor 72 (72a, . . . , 72n) and a high speed CMOS comparator 74 (74a, . . . , 74n). The resistor, as hereinafter discussed, is used to form an RC filter with the effective capacitance $C_x$ of the clock receiver. This low pass RC filter, in addition to attenuating performance degrading unwanted signals, which might be present at frequencies greater than $F_1$, also helps damp the clock bus at frequencies higher than $F_1$ as previously described. As shown, the resistor 72 is coupled between the clock bus 25 and one input of the comparator, while the other input of the comparator is preferably coupled to a desired threshold voltage. For this particular embodiment, the second input to comparator 74a is set at $V_{cc}/2$ (nominally the same voltage as the generator bias) via use of a voltage divider 77 having resistors 78 and 79 which divide down the logic voltage rail, $V_{cc}$, in half. Similar resistors (not shown) are preferably provided for each comparator. Thus, the comparators 74 will provide a first indication when the voltage received from the clock bus is greater than $V_{cc}/2$, and a second indication when the voltage received from the clock bus is less than $V_{cc}/2$. Since the clock bus voltage is centered around 2.5 volts, a fifty percent duty cycle is effectively set up as the received clock signal. It should be noted that by providing the clock signal to a CMOS comparator 74, the clock receivers effectively present an extremely high real impedance to the clock bus 25 at frequency $F_1$.

In the topologically linear system of the invention, there are three primary parameters: $F_1$, $C_T$, and $t_L$. Parameter $F_1$ is the frequency of the desired clock; parameter $C_T$ is the total low frequency capacitance of the clock bus 25; and parameter $t_L$ is the intrinsic propagation delay from one end of the system 10 to the other end, i.e., the electrical size of the system. The frequency $F_1$ of the desired clock is usually set by system requirements. The frequency $F_1$ has an upper bound determined by parameters $C_T$ and $t_L$ as hereinafter discussed.

The total low frequency capacitance of the clock bus 25, $C_T$, which is shown in phantom in FIG. 4a can generally be described as the sum of: the native "raw etch" capacitance of the bus itself ($C_0$); the sum of the unoccupied access node parasitic capacitances and connector capacitances ($C_p$); and the sum of the capacitances of the access node entities which are present ($C_x$) which are also shown in phantom in FIG. 4a. Since, in general, the node occupancy is variable, the total low frequency capacitance $C_T$ has a maximum value $C_{T-max}$, and a minimum value $C_{Tmin}$.

When the constraints, as previously described, are imposed, the impedance seen at any node in the system at frequency $F_1$ will lie substantially on the $-j$ axis, having an effective capacitance of $C'_T$. Effective capacitance $C'_T$ is greater than $C_T$ by an amount approximately equal to the range of amplitudes which would exist in the system (i.e., for the linear system and a 1/16 wave length $C'_T \approx 1.1 C_T$. In simplified terms, $C'_T$ is a function of $C_T$, $F_1$, and $t_L$. The precise relationship between $C_T$ and $C'_T$ for a given system can be derived by the direct application of transmission line equations or determined by computer simulation.

The intrinsic propagation delay $t_L$ from one end of the system 10 to the other end is a function of nodal occupancy and is greatest when $C_T$ is at $C_{T-max}$. The propagation delay $t_L$ implies n quarter wave resonances. The lowest of the quarter wave resonances is $f_{R_0} = 4/t_L$. The effective first quarter wave resonance $f_{R0}$ is a function of the location at which the sine wave generator is situated on the sine wave clock bus. If the sine wave generator is located on the end of the bus, $f'_{R0} = f_{R0}$. On the other hand, if the sine wave generator is located in the electrical middle of the bus, $f'_{R0} = 2f_{R0}$. Thus, in the preferred embodiment of the invention, the sine wave generator 20 is situated at the electrical middle of bus 25.

In order for the system to have substantially the same sine wave amplitude (e.g., ±10%) everywhere on the bus, $F_1$ must be significantly less than $f'_{R0}$. In particular, for a ±10% amplitude (~1 db), $F_1$ should be less than or equal to $f'_{R0}/4$; in other words, for the amplitude of the signal to be substantially the same all along the length of the bus, the bus length should be limited to less than 1/16 the wavelength of the sine wave. For a loss-less line of characteristic impedance $Z_0$ which is unterminated, the voltage $V_1$ at the clock generator end (where the clock generator is located at one end) is $V_1 = V_2 \cos\Theta$, where $V_2$ is the voltage at the end opposite the clock generator end, and $\Theta$ is the electrical length ($t_L$) of the bus in degrees. Thus, if the bus were permitted to be as long as 1/4 of the sine wavelength, the voltage $V_1$ at the generator end of the line would become zero as the cosine of ninety degrees is zero. In other words, at a quarter wavelength, the open stub looks like a short circuit.

In addition to having the clock bus voltage being substantially the same amplitude along the entire bus, it is desirable to maintain a minimum absolute amplitude. As previously discussed, resistor 64 which couples the clock wave generator to the bus 25 forms a low pass RC filter with the bus at frequency $F_1$, as the bus has an effective capacitance $C'_T$. In order to control the absolute amplitude of the clock signal to, e.g., ±0.5 db, the resistance of resistor 64 is set according to:

$$R_{64} \leq [2\pi(2)F_1 C'_{T-max}]^{-1} \quad (1)$$

Using FIG. 4a as in illustrative example, for a multiplexer backplane having one or two shelves connected by a cable, with each shelf capable of sixteen cards (i.e., sixteen cards for one shelf; thirty-two cards for two shelves . . . ), and where F1=4,096 MHz, realistic values for $C_T$ and $t_L$ are as follows: 90 pf $\leq C_T \leq$ 450 pf; and 4 nsec $\leq t_L \leq$ 14 nsec. With $t_L$ so defined, $f_{R0-min} \geq 17.8$ MHz. Also, with $C_T$ so defined, the resistance of resistor 64 for the 4.096 MHz system is $\leq 43$ ohms based on equation (1) above. It is because of this low value of resistor 64 that the buffer 62 of gain=1 is provided between the low pass filter and the clock bus 25.

Figure 4B:
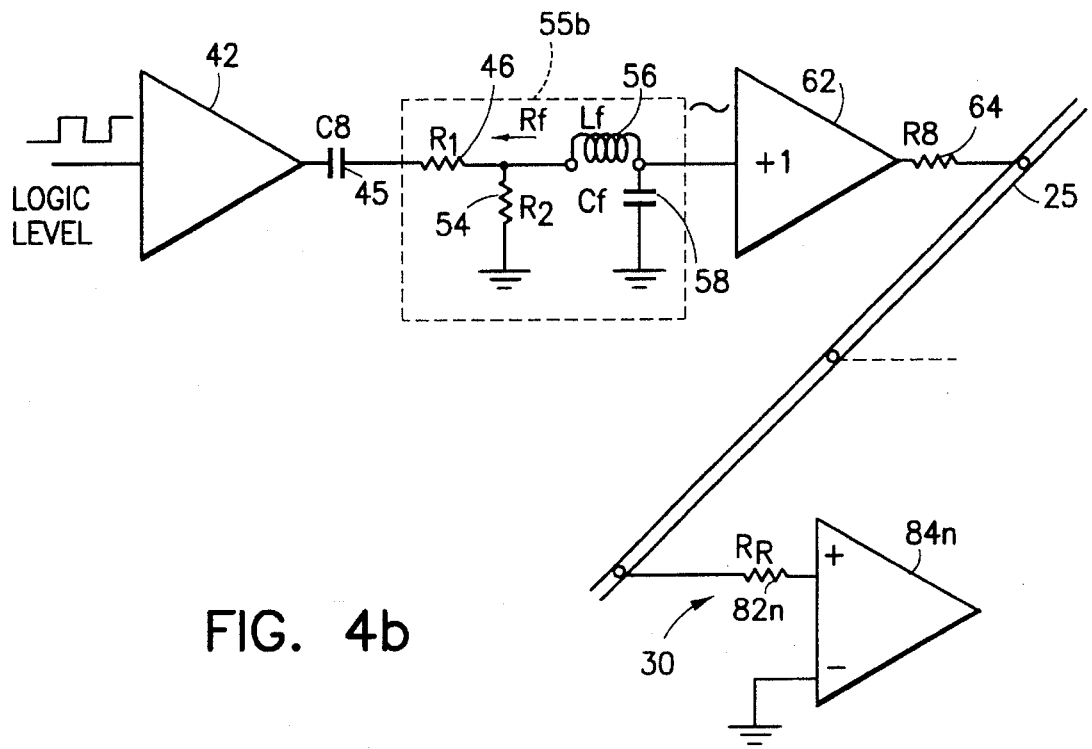
FIG. 4b is a circuit diagram of a ground referenced sine wave clock system configuration.

A similar system to that of FIG. 4a is seen in FIG. 4b where a ground referenced sine wave clock system is shown. In FIG. 4b, a square wave signal is fed to CMOS driver 42 which provides a zero (ground) and five volt ($V_{cc}$) output; thereby effectively making the sine wave reference level equal to $2.5V = V_{cc}/2$. Coupled to the output of the driver 42 is a first plate of a DC blocking capacitor 45 which allows a different voltage reference level to be established on the low pass filter side of the capacitor. Coupled to the other plate of the capacitor 45 is another portion of the low pass filter 55b which has a Q equal to one, and a cut-off frequency equal to the input frequency of the digital square wave. The second portion of the low pass filter 55b includes resistors 46 and 54, inductor 56, and capacitor 58. Resistor 46 is coupled to the second plate of the capacitor 45. Resistor 54 is coupled between ground and resistor 46. Inductor 56 is also coupled to resistors 46 and 54, and the capacitor 58 is coupled between the inductor 56 and ground. With the provided filter 55b, the reference level of signal is reestablished to ground by resistor 54, and harmonics of the input frequency are filtered out. The filtered signal is then provided to a buffer 62 having a linear gain of one which is coupled to the sine wave clock bus 25 by resistor 64. As previously mentioned, because the sine wave clock bus 25 has an effective capacitance, the resistor 64 in conjunction with the bus 25 effectively provide an additional RC filter which helps eliminate low order harmonics and some other higher frequency signals which might be present and which are undesirable.

Also coupled to the bus 25 are one or more clock receivers 30. The clock receivers are generally comprised of a resistor 82 (82a, . . . , 82n) and a high speed CMOS comparator 84 (84a, . . . , 84n). The resistor 82 is coupled between the clock bus 25 and the positive input of the comparator, while the other input of the comparator is preferably coupled to ground (in this case ground being the desired threshold voltage). Thus, the comparators 74 will provide a first indication when the voltage received from the clock bus is greater than zero volts (ground), and a second indication when the voltage received from the clock bus is less than zero volts. Since the clock bus voltage is recentered around ground by resistor 54, a fifty percent duty cycle is effectively set up as the received clock signal.

Figure 5A:
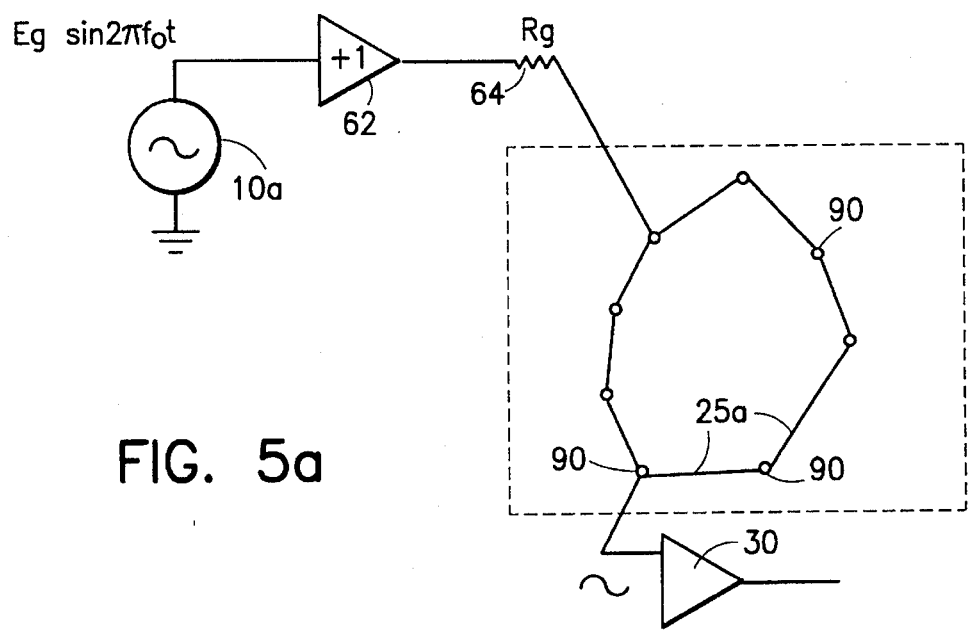
FIGS. 5a and 5b are schematic diagrams of topologically non-linear sine wave bus systems arranged in a ring and in a star.
Figure 5B:
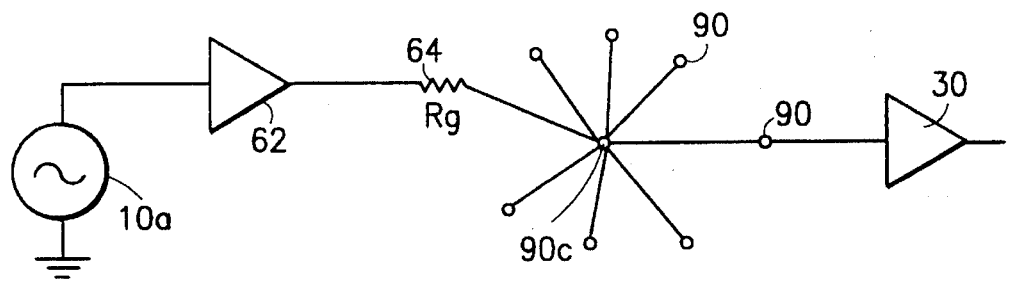

It should be appreciated by those skilled in the art, that the sine wave bus topology need not be limited to a linear topology. Rather, as seen in FIGS. 5a and 5b, different useful topologies such as rings and stars can be utilized. In FIG. 5a, the nodes 90 are arranged in a ring, with each node coupled by the sine wave bus 25a to two other nodes. Coupled to at least one of the nodes is the sine wave clock generating driver 10a which is coupled to the sine wave bus 25a via a buffer 62 and resistor 64. Coupled to at least one other node is a clock receiver 30. As shown in FIG. 5a, the sine wave generating driver 10a is an oscillator coupled to ground. However, it will be appreciated that the driver 10a could be the identical driver 10 discussed above with reference to FIG. 4a.

The system of FIG. 5b is similar to that of FIG. 5a, except that instead of the nodes being arranged in a ring, they are arranged in a star configuration with more than two nodes connected to a single node. While the sine wave clock generating driver 10a is shown coupled to the "central" node 90C, it will be appreciated that such an arrangement is not required, as the driver 10a could be coupled to any of the other nodes of the system. Likewise, it will be appreciated that more than one node can be a central node with three or more nodes coupled thereto. In fact, the star configuration can coexist in conjunction with the linear and ring topologies set forth with reference to FIGS. 4a, 4b, and 5a. In fact, other topologies such as a grid or mesh topology can be utilized.

Figure 6:
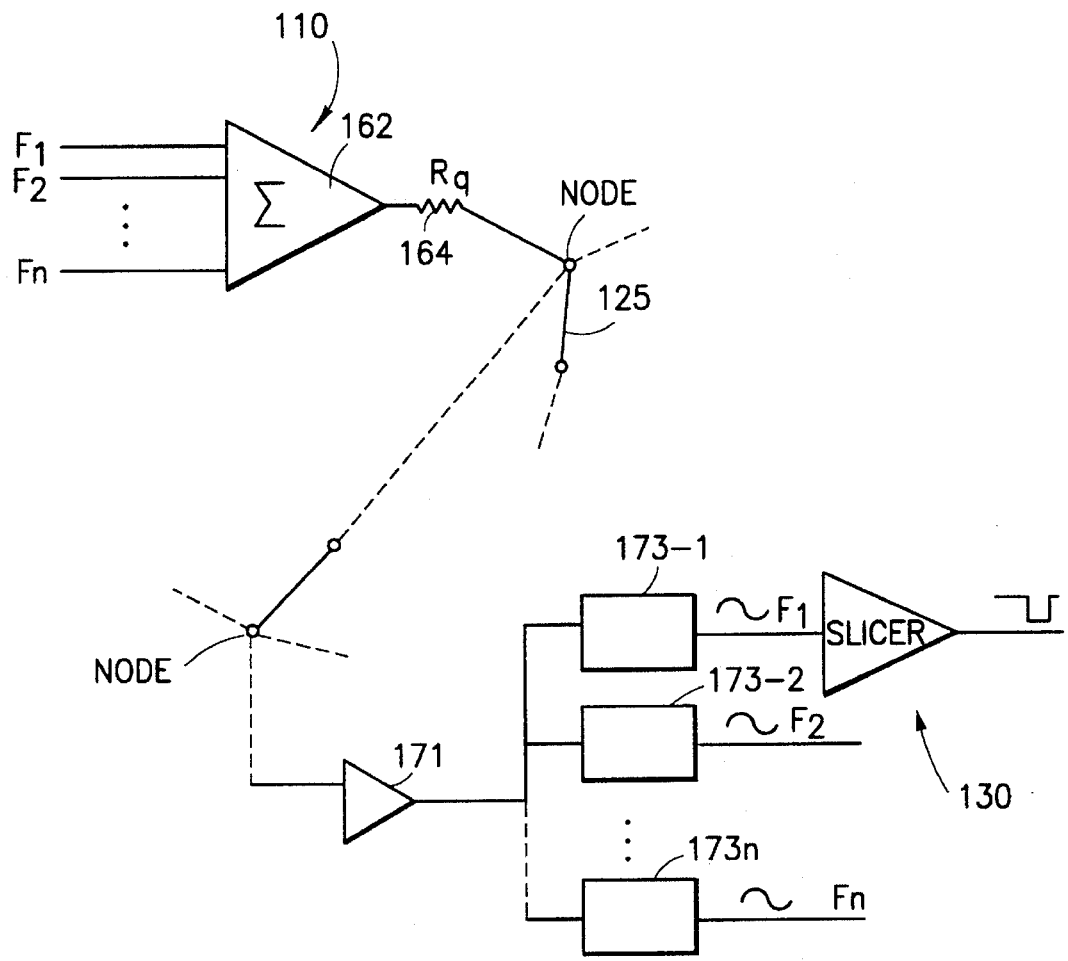
FIG. 6 is a partial circuit and partial schematic diagram of a non-phase locked multifrequency sine wave clock bus system with a multifrequency generator and a multifrequency receiver being shown in circuit format.

Turning to FIG. 6 a multifrequency sine wave clock bus system is seen with a multifrequency generator 110 and a multifrequency receiver 130. As shown in schematic form, a plurality of frequencies F1 through Fn are linearly superimposed by summing them at the summer/buffer 162 and are fed to the bus 125 via resistor 164. On the receiver end, the receiver 130 includes a linear buffer 171, a plurality of pass-band filters 173-1 . . . 173-n, and a plurality of slicers or comparators 174. The receivers 130 receive the composite wave form, and the pass band filters 173 are arranged to divide the received composite wave form into its component parts. Thus, each component frequency is passed by a different band pass filter, and the comparator 174 for that particular band pass filter compares the incoming signal to provide a substantially distortion free square wave output of desired duty cycle (e.g., fifty percent) at the component frequency and at the desired voltage. It will be appreciated that with the provided arrangement, the phase for a particular frequency at all nodes will be the same, while the relative phases between the different frequencies will not necessarily be known or fixed. This result is caused by the fact that there is no control at the generator which forces phase coherence between the different incoming frequency signals. Regardless, the multifrequency system is useful wherever more than one clock frequency is required for the system, and no phase coherence for the different clock signals is required.

Figure 7:
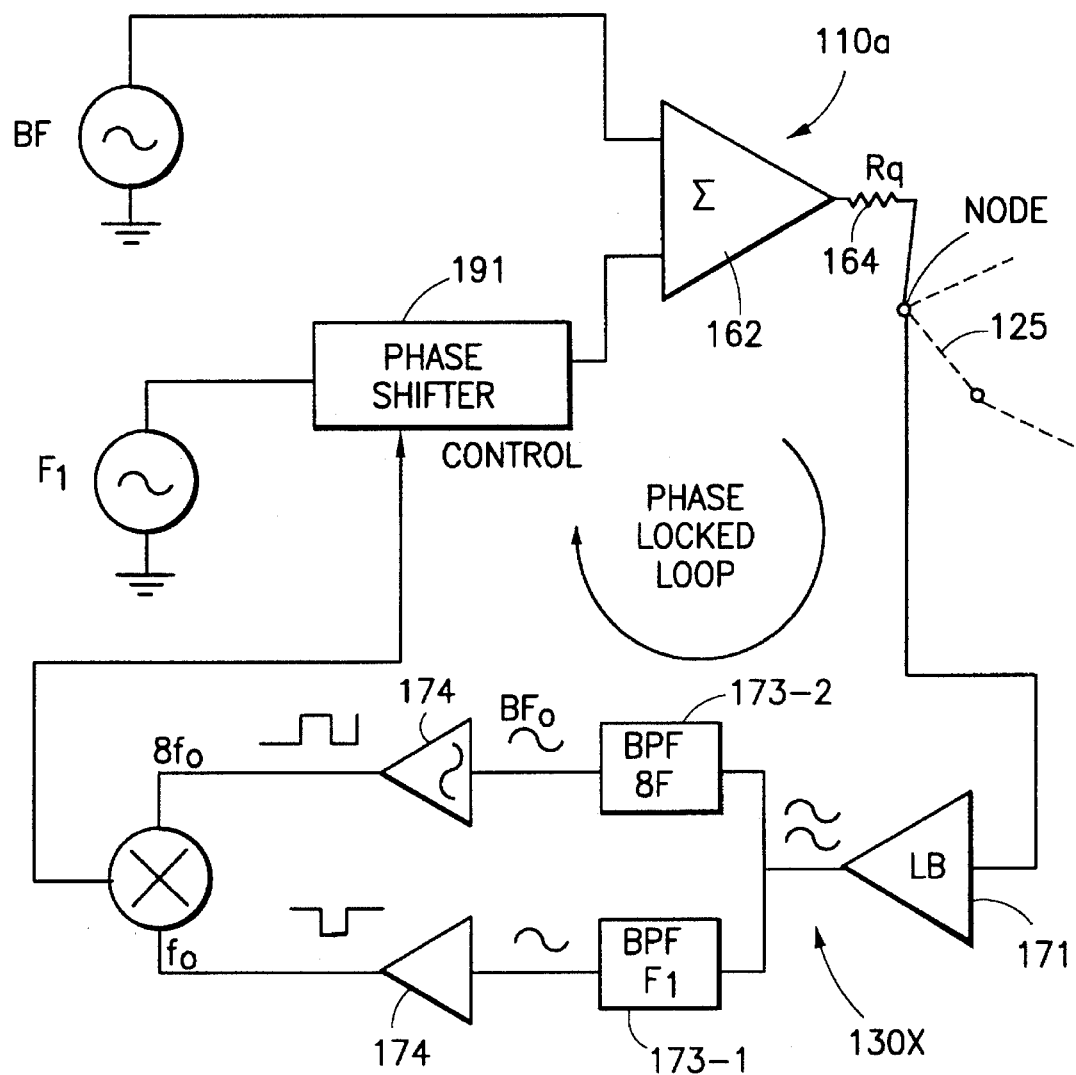
FIG. 7 is a partial circuit and partial schematic diagram of a phase locked multifrequency sine wave clock bus system where the frequencies are related by a rational number.

The multifrequency sine wave clock bus system of FIG. 7 provides the phase coherence which is not a part of the system of FIG. 6. In particular, a particular coherent multifrequency generator 110a is shown with two input frequencies of $F_1$ and $8F_1$, with a phase shifter 191 shifting the phase of the $F_1$ input signal. As will be discussed hereinafter, control of the phase shifter 191 is obtained by providing a receiver 130X at the node of the generator 110a and providing feedback. Regardless, the phase shifted signal $F_1$, and the other frequency signal $8F_1$ are summed at summer/buffer 162, and output to the bus 125 via resistor 164.

As aforementioned, the phase coherent multifrequency generator 110a has a receiver 130X. Receiver 130X is arranged similarly to the receivers shown in FIG. 6 with a linear buffer 171, a plurality of band pass filters 173-1 . . . 173-n, and a plurality of slicers or comparators 174. The receiver 130X receives the composite wave form, and the pass band filters 173 are arranged to divide the received composite wave form into its component parts and pass those parts to comparator/slicers 174 which provide substantially distortion free square wave outputs at the component frequencies. Receiver 130X also includes a phase comparator 193 which provides a control output for the phase shifter 191 by comparing the phases of the square wave outputs and generating an error signal whenever the rising edges of the signals are not simultaneous. This error signal is then utilized in a phase locked loop servo as the feedback control to the phase shifter 191. As a result, the phase shifter 191 causes the phase of the input signal $F_1$ to shift and be coherent with the phase of the other input signal. Thus, the phase of the input signals will be fixed relative to each other at the generator 110a as well as at any receiver at any other node of the system. The case of the example of FIG. 7 has particular application to the telephone company's central office where telecommunication signals of 8 KHz and 64 KHz frequencies are generated. These 8 KHz and 64 KHz signals presently require point to point terminated distribution to every bay requiring the signals, but could benefit from the sine wave clock distribution system of the invention.

As hereinbefore described, the use of a standing sine wave to distribute clock information has a limit on the maximum frequency depending upon the electrical size of the system, or conversely has a limit on the maximum size of the system based on the desired frequency. For example, in a linear system, the bus length should be limited to less than 1/16 the wavelength of the sine wave in order to guarantee similar amplitude throughout the system. The arrangement set forth in the schematic diagram of FIG. 8 overcomes this limitation by providing separate but linked sub-distribution circuits with a common phase locked generator driving system so that absolute phase is maintained in the composite arrangement.

Figure 8:
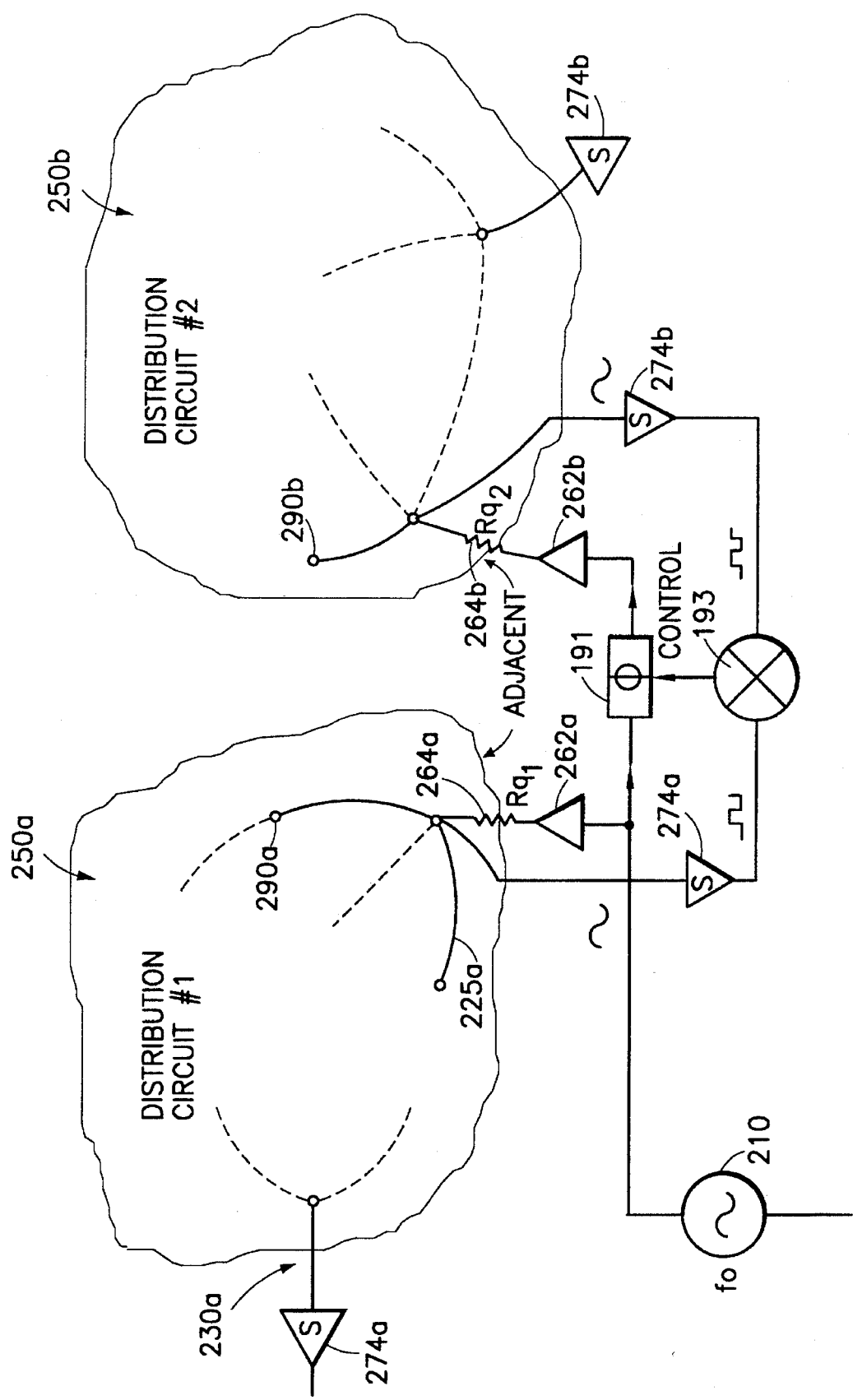
FIG. 8 is a schematic diagram of sine wave clock bus system having a master device which generates and distributes the clock, and one or more slave devices.

As seen in FIG. 8, a clock generator 210 is provided which generates a sine wave signal for distribution to two distribution circuits 250a and 250b. Distribution to distribution circuit 250a is via buffer 262a and resistor 264a to bus 225a of the distribution circuit 250a. Distribution circuit 250a has a plurality of nodes 290a, and one or more receivers 230a with slicers or comparators 274a. One of the slicers 274a (preferably the one coupled to the node to which the generator is coupled) is used as part of a feedback circuit which is similar to the feedback circuit discussed above with reference to FIG. 7. Thus, the signal being received by all nodes 290a in distribution circuit 250a is sampled by the slicer 274a which provides a square wave signal to a comparator 293 for comparing the signal to a similar signal received from a slicer 274b of distribution circuit 50b as described below. The comparative phase determined by comparator 293 is used as a control signal for a phase controller 291. The phase controller 291 also receives the sine wave signal generated by clock generator 210, and changes the phase of the incoming signal according to the control signal received from the comparator 293. The phase changed signal is then forwarded to distribution circuit 250b via buffer 262b and resistor 264b to bus 25b. Distribution circuit 250b also has a plurality of nodes 290b and one or more receivers 293b with slicers or comparators 274b. As aforementioned, the signal received at one slicer 274b (preferably located at the node to which the generator is coupled) is fed back to the phase comparator 293. In this manner, the phase of the sine wave signal which is fed into distribution circuit 250b is forced to be the same as the phase of the sine wave signal which is fed into distribution circuit 250a. Thus, all nodes 290a and 290b of all of the system are receiving the same sine wave signal at the same time. It should be appreciated that in principle, systems of very large size can be realized by appropriately linking a number of sub-distribution circuits either by a common clock system and/or by cascading clock systems. It will also be appreciated that these complex systems could be multifrequency systems such as disclosed above with reference to FIGS. 6 and 7.

As indicated above, many different types of receivers can be utilized in conjunction with the invention provided that the receiver presents a high impedance interface to the sine wave clock bus. Generally, the receiver takes the form of a slicer/comparator which may be a discrete component or a component of an integrated circuit, and which may be embodied in CMOS or bipolar technology. The basic parameters of the receiver, account of which should be taken, include: accuracy of the slicing level; speed and delay; input capacitance ($C_x$); high input real impedance ($R_x$); high input $Q=\frac{1}{2}\pi f_0 C_x R_x$; and input leakage. In some circumstances, special care must be taken to limit inaccuracy in the reference voltage slicing level, as that inaccuracy can result in errors in the phase and/or symmetry of the system. A further potential issue is that the rail voltage ($V_{cc}$) of the generator may be different from that of the receiver. Even with a perfect divider, such a situation would result in slicing offset. Thus, based on the required accuracy and applications, different types of receivers may be suitable.

Figure 9A:
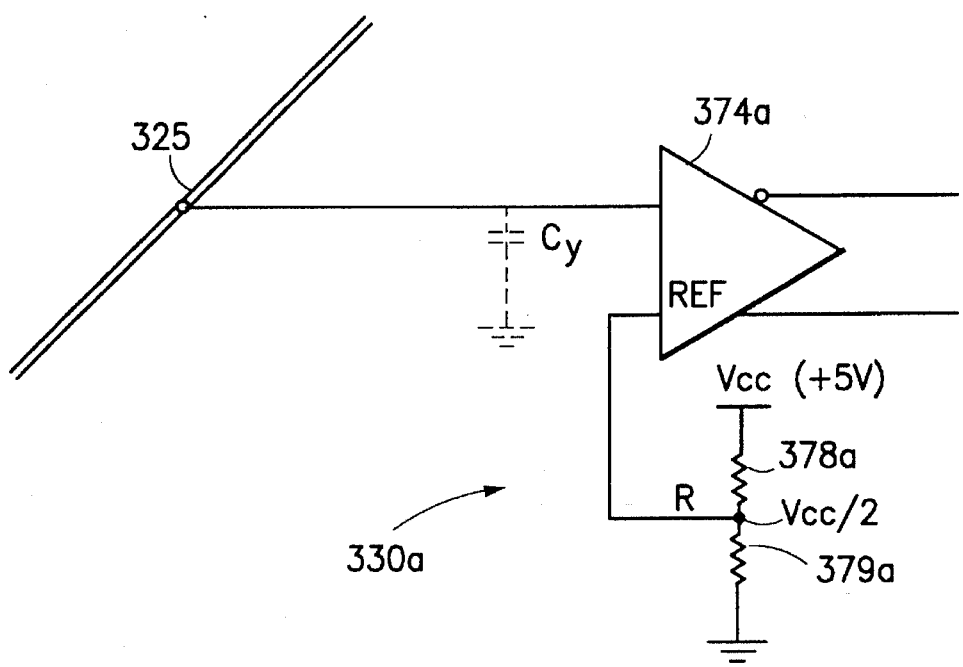
FIG. 9a is a circuit diagram of a DC coupled slicer receiver.

The receiver 330a shown in FIG. 9a has a complementary output comparator 374a having its positive input being coupled to the clock bus 325, and its negative input being provided with a reference voltage determined by the resistors 378a, 379a of a voltage divider. With the provided arrangement, the receiver 330a provides a positive output or digital "1" (with a complementary signal) when the voltage on the clock bus exceeds the reference voltage, and a negative output or digital "0" when the voltage on the clock bus is less than the reference voltage. With the provided arrangement, receiver 330a is a "slicer" in that it slices the incoming signal based on the reference voltage and provides a square wave output signal based on the comparisons made.

Figure 9B:
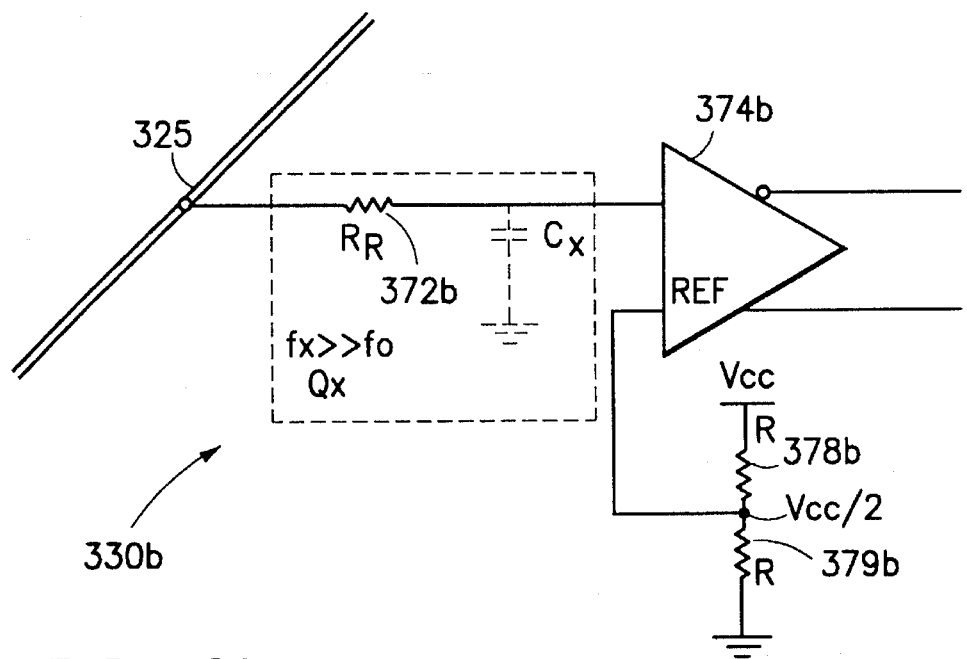
FIG. 9b is a circuit diagram of a DC coupled slicer receiver having a low pass filtered input.

The receiver 330b of FIG. 9b is similar to that of FIG. 9a and was previously described above with reference to FIG. 4a. Receiver 330b has the added advantage relative to the receiver 330a of FIG. 9a in that a first order RC low pass filter is provided by resistor 372b and the effective capacitance of the clock receiver for filtering the positive (+) input signal to the comparator 374b. This first order RC low pass filter effectively attenuates the corrupting influence of noise which may be on the bus due to, e.g., cross-talk.

Figure 9C:
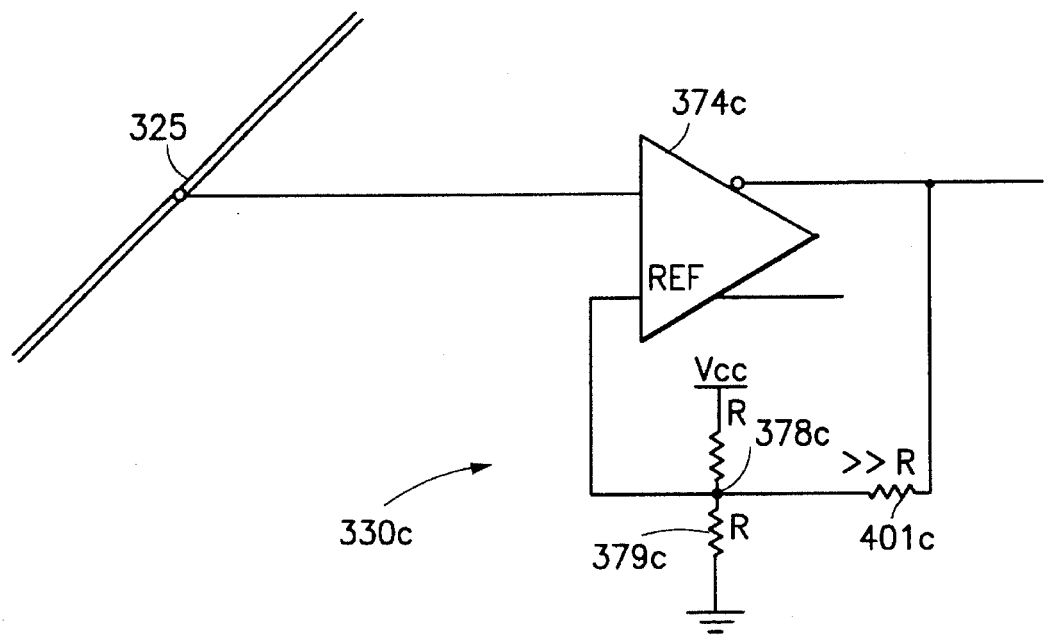
FIG. 9c is a circuit diagram of a DC coupled slicer with hysteresis.

A third receiver 330c is seen with reference to FIG. 9c. The receiver 330c is fashioned as a "Schmitt-type trigger" by coupling the complementary output of the comparator 374c via a large resistor 401c and a voltage divider having resistors 378c and 379c to the reference (negative) input of the comparator 374c. Where the bus clock signal is expected to have a DC bias of $V_{cc}/2$, resistors 378c and 379c are preferably chosen to be equal so as to generate a reference voltage of $V_{cc}/2$. When the input signal to the positive input of the comparator 374c exceeds the reference voltage, the positive output of the comparator goes high, and the complementary output goes low (e.g., to ground). This results in resistor 401 being in parallel with resistor 379c which results in a slightly smaller resistance between the reference and ground, and causes the reference voltage to be pulled slightly lower. With a slightly lower reference voltage, the effect of noise in the signal will be significantly reduced, and the positive output will remain high until the clock bus signal dips below $V_{cc}/2$ and to the slightly lower reference voltage. At that point, the positive output will go low, and the complementary output will go high (to $V_{cc}$). As a result, resistor 401 will be in parallel with resistor 378c, resulting in a slightly smaller resistance between $V_{cc}$ and the reference. As a result, the reference voltage will be pulled slightly higher than $V_{cc}/2$, and the positive output will remain low until the clock bus signal rises slightly above $V_{cc}/2$ to the slightly higher reference voltage. It will be appreciated that the filtering RC circuit of FIG. 9b could be used in conjunction with the receiver of FIG. 9c if desired.

Figure 9D:
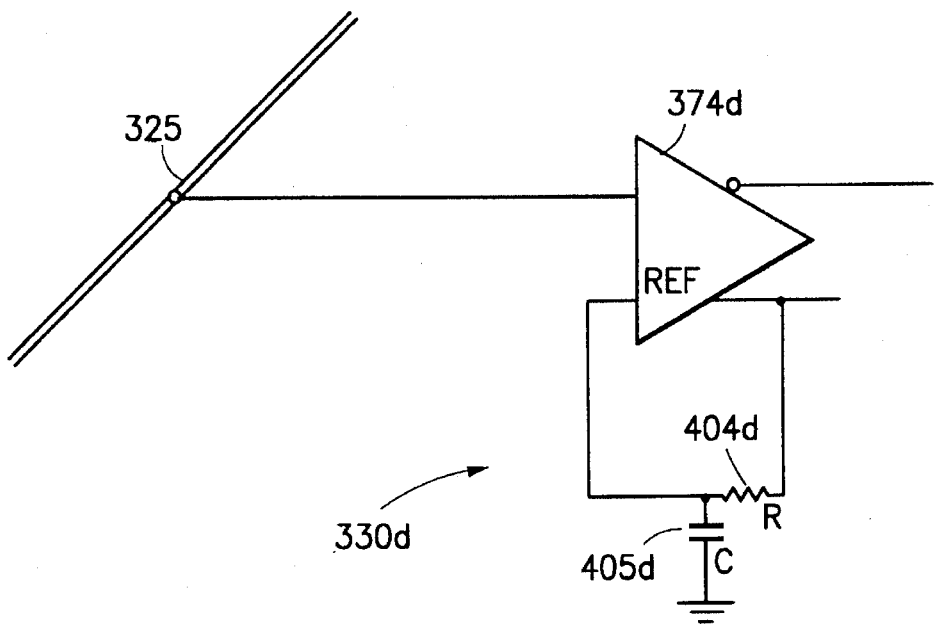
FIG. 9d is a circuit diagram of a DC coupled slicer with a bias correcting first order feedback servo.
Figure 9E:
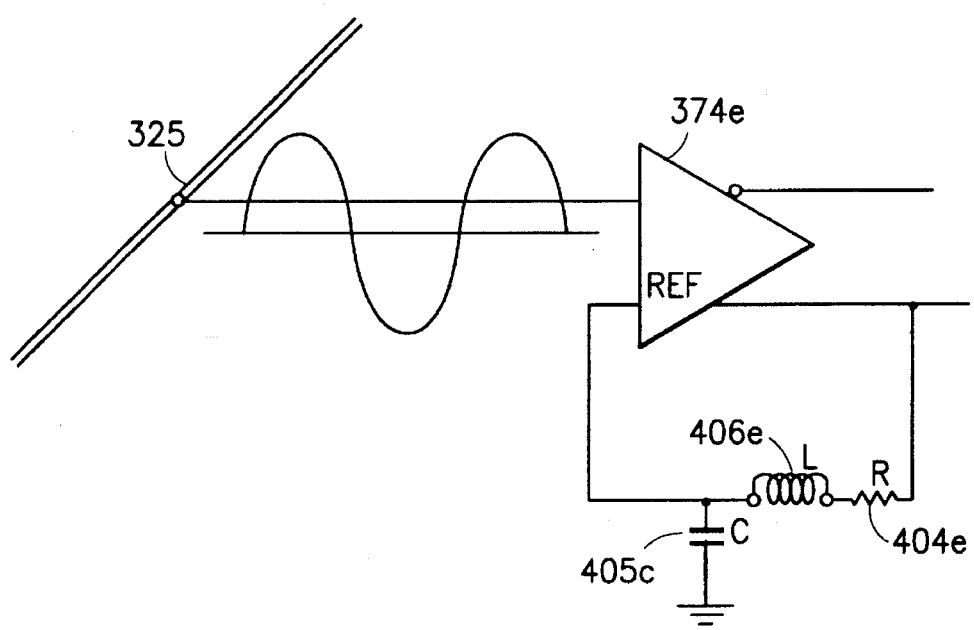
FIG. 9e is a circuit diagram of a DC coupled slicer with a bias correcting, second order feedback servo.
Figure 9F:
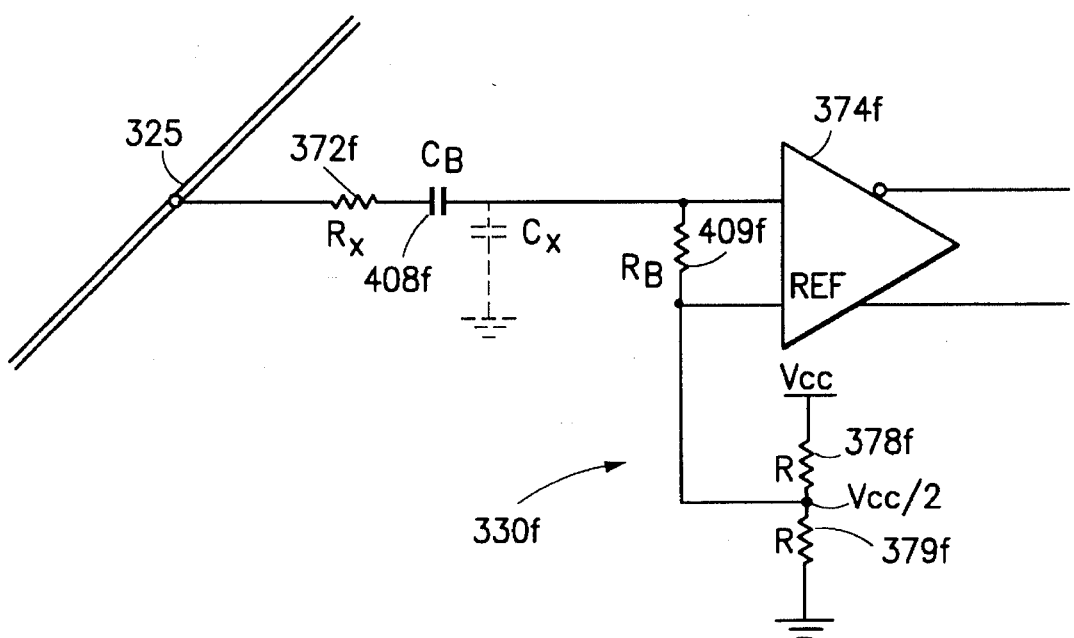
FIG. 9f is a circuit diagram of an AC coupled slicer including an input low pass filter.

The receivers of FIGS. 9d, 9e and 9f are specifically designed to substantially reduce the slicing offset which might otherwise occur. In FIG. 9d, the receiver 330d is comprised of a complementary output comparator 374d in conjunction with a feedback first order low pass filter servo having a resistor 404d, and a capacitor 405d. The resistor 404d is coupled between the primary output of the comparator 374d and the reference (negative) input into the comparator, while the capacitor 405d is coupled between the reference input and ground. The values of the capacitor and resistor are chosen in order to provide a low pass filter which effectively filters out all but the DC component of the comparator output signal. As a result, the filter effectively measures the duty cycle of the output. When the duty cycle of the output is less than fifty percent, the reference voltage generated by the first order RC low pass filter is low, and tends to cause the duty cycle to be increased. Conversely, when the duty cycle is greater than fifty percent, the reference voltage generated at the reference input of the comparator is high and tends to cause the duty cycle to be decreased. The provided receiver 330d thus tends to provide a duty cycle of fifty percent without relying upon the use of a reference voltage ($V_{cc}$) at the receiver. It should be noted however, that with the first order RC low pass filter, a small triangular wave ripple voltage which is ninety degrees out of phase with the incoming sine wave is generated on top of the DC voltage by the filter. This ripple voltage does tend to slightly degrade the output square wave clock signal.

The receiver 330e of FIG. 9e overcomes any of the negative effects of the small ripple voltage generated by the feedback servo filter of FIG. 9d by providing a second order RLC low pass filter in the feedback rather than the first order RC low pass filter of FIG. 9d. The second order RLC low pass filter includes the resistor 404e, capacitor 405e, and an inductor 406e, with the resistor 404e and inductor 406e in series between the primary output of the comparator 374e and its reference input, and the capacitor 405e coupled between the reference input and ground. Again, the values of the resistor 404e, capacitor 405e, and inductor 406e are chosen in order to provide a low pass filter which filters out all but the DC component of the incoming signal. However, with a second order RLC low pass filter in the feedback servo, the ripple voltage which is generated on top of the DC voltage by the filter is substantially a sine wave which is one hundred eighty degrees out of phase with the incoming sine wave. This arrangement is beneficial in that the discrimination by the comparator 374e is enhanced due to the ripple voltage.

Yet another receiver 330f which reduces slicing offset is seen with reference to FIG. 9f. Receiver 330f has a complementary output comparator 374f having its positive input coupled to the sine wave clock bus via a resistor 372f and a large capacitor 408f, and its negative input being provided with a reference voltage determined by the resistors 378f, 379f of a voltage divider. Coupled between the positive and reference inputs of the comparator 374f is a large resistor 409f. The resistor 409f is chosen to be large so that a large impedance will be presented to the sine wave clock bus 325 as required. It will be appreciated by those skilled in the art, that the relatively large capacitor 408f coupled between the clock bus and the comparator filters out the DC components of the incoming clock, and only some AC components of the signal will reach the comparator. It will also be appreciated that a new DC bias level is established at the positive input of the comparator 374f of the receiver 330f by the voltage divider. Thus, the positive input of the comparator 374f receives the AC component of the incoming clock signal superimposed on the reference voltage, while the negative input of the comparator 374f receives exactly that reference voltage. Thus, the comparator 374f can slice the incoming signal without reference to a voltage rail signal.

There have been illustrated and described herein clock distribution systems utilizing standing sine wave clock signals on a clock bus. While particular embodiments of the invention have been described, it is not intended that the invention be limited thereto, as it is intended that the invention be as broad in scope as the art will allow and that the specification be read likewise. Thus, while particular circuitry was described for generating a sinusoidal wave via the use of CMOS drivers, a low pass filter, etc., it will be appreciated that other circuits could be utilized provided that the circuit outputs to the clock bus a substantially pure sine wave. For example, instead of the CMOS drivers, an oscillator with accompanying analog or bipolar driving circuitry could be utilized. Also, while various clock receiving circuits were described as circuits utilizing a high impedance CMOS interface, it will be appreciated that other high impedance interfaces can be utilized. Likewise, while particular parameters were described as having limiting effects on the sine wave frequency of the bus as well as the bus length, it will be appreciated that if greater amplitude and phase differences are tolerable, the values for the parameters of interest may be relaxed. For example, instead of requiring that the amplitudes at different nodes along the clock bus be within ±10% of each other, in some circumstances, ratios of amplitudes of two to one or more can be tolerated. Also, while particular values for resistors, capacitors, etc. were provided for particular systems of particular frequencies, it will be appreciated that other circuits can be utilized with different resistance and capacitance values, and systems of different frequencies could be utilized. In fact, while the invention is particularly advantageous for high speed systems (e.g., above 1 MHz), it will be appreciated that advantages are also obtained in lower speed systems. It will therefore be appreciated by those skilled in the art that yet other modifications could be made to the provided invention without deviating from its spirit and scope as so claimed.

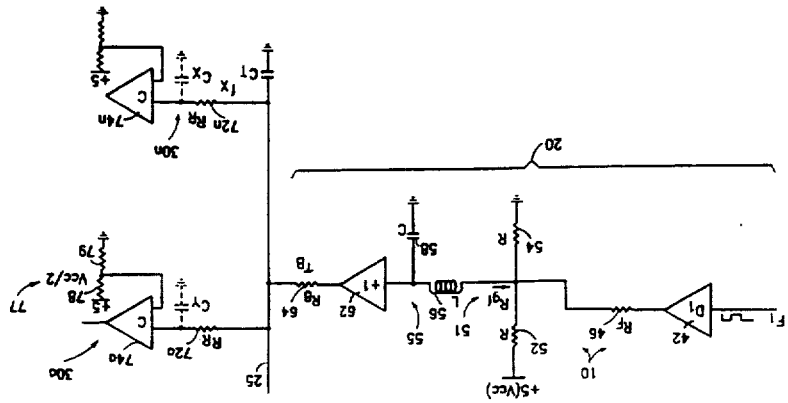

I claim:

1. A clock distribution system for a digital synchronous system, where the clock distribution system provides both frequency and phase reference information, comprising:
   a) an unterminated clock transport means having at least one transmission line segment, each transmission line segment of said transport means being substantially loss-less at a predetermined frequency of interest, and each line segment having two nodes, wherein said unterminated clock transport means has a plurality of nodes;
   b) sine wave generating and driving means connected to one of said plurality of nodes of said unterminated clock transport means, said sine wave generating and driving means for generating a standing sine wave at said predetermined frequency of interest in said transport means;
   c) at least one clock receiving means, each clock receiving means connected to one of said plurality of nodes of said unterminated clock transport means and presenting a substantially loss-less capacitive load at said predetermined frequency of interest to said unterminated clock transport means, each clock receiving means for receiving said standing sine wave and determining frequency and phase reference information from said standing sine wave,
   wherein said standing sine wave crosses a voltage threshold at a crossing instance, and wherein the crossing instances of said standing sine wave at said plurality of nodes on said unterminated clock transport means seen by each of said clock receiving means are substantially simultaneous.

2. A clock distribution system according to claim 1, wherein:
   the phase of said standing sine wave seen by each of said clock receiving means is identical.

3. A clock distribution system according to claim 2, wherein:
   said standing sine wave has a first amplitude at a first of said plurality of nodes along said unterminated clock transport means, and said standing sine wave has a second amplitude at any second of said plurality of nodes along said unterminated clock transport means, and said ratio of said first and second amplitudes is at most two to one.

4. A clock distribution system according to claim 3, wherein:
   said second amplitude is within ±10% of said first amplitude.

5. A clock distribution system according to claim 1, wherein:
   said at least one transmission line segment comprises a plurality of line segments, with each line segment having at least one node in common with another line segment.

6. A clock distribution system according to claim 5, wherein:
   said plurality of line segments constitutes a polygon.

7. A clock distribution system according to claim 5, wherein:
   said plurality of line segments comprises at least three line segments sharing a first single node.

8. A clock distribution system according to claim 7, wherein:
   said sine wave generating and driving means is coupled to said unterminated clock transport means at said first single node.

9. A clock distribution system according to claim 1, wherein:
   said sine wave generating and driving means is located at a substantially electrical middle of said unterminated clock transport means.

10. A clock distribution system according to claim 1, wherein:
    said standing sine wave of at least one frequency comprises a standing sine wave at substantially only one frequency.

11. A clock distribution system according to claim 8, wherein:
    said substantially only one frequency is a frequency exceeding 1 MHz.

12. A clock distribution system according to claim 1, wherein:
    said sine wave generating and driving means comprises
    a first clock signal at said predetermined frequency of interest,
    a first driver having an input and an output, with said input of said first driver coupled to and receiving said first clock signal, and
    a low pass filter having an input coupled to said first driver and an output coupled to said unterminated clock transport means.

13. A clock distribution system according to claim 12, wherein: said low pass filter comprises first and second resistors, an inductor, and a capacitor, wherein said first resistor is coupled between said first driver and a first voltage rail, said second resistor is coupled between a second voltage rail and said first resistor, said first and second resistors comprising a voltage divider, said inductor being coupled between said first driver and said unterminated clock transport means and said capacitor being coupled between said inductor and said second voltage rail.

14. A clock distribution system according to claim 13, wherein:
said sine wave generating and driving means further comprises a buffer amplifier having an input coupled to said capacitor and to said inductor and an output coupled to said unterminated clock transport means.

15. A clock distribution system according to claim 14, wherein:
said sine wave generating and driving means further comprises an interface resistor coupled between said buffer amplifier and said unterminated clock transport means, said interface resistor and said unterminated clock transport means effectively providing an RC filter.

16. A clock distribution system according to claim 13, wherein:
said sine wave generating and driving means further comprises
a buffer amplifier having an input coupled to said capacitor and to said inductor and an output coupled to said clock bus, and
an interface resistor coupled between said buffer amplifier and said unterminated clock transport means, said interface resistor and said unterminated clock transport means effectively providing an RC filter.

17. A clock distribution system according to claim 12, wherein:
said low pass filter is tuned to pass a substantially sinusoidal signal having a frequency of said first clock signal.

18. A clock distribution system according to claim 1, wherein:
each said clock receiving means comprises a high speed comparator having a first input coupled to said unterminated clock transport means and a second reference voltage input, said high speed comparator presenting a high impedance to said unterminated clock transport means.

19. A clock distribution system according to claim 18, wherein:
said clock receiving means further comprises a voltage divider including a first resistor coupled between a first voltage rail and said second reference voltage input and a second resistor coupled between a second voltage rail and said second reference voltage input.

20. A clock distribution system according to claim 19, wherein:
said clock receiving means further comprises a third resistor coupled between said first input of said high speed comparator and said unterminated clock transport means.

21. A clock distribution system according to claim 19, wherein:
said clock receiving means further comprises a third resistor coupled between a first output of said high speed comparator and a node between said first and second resistors.

22. A clock distribution system according to claim 18, wherein:
said clock receiving means further comprises a first resistor coupled between a first output of said high speed comparator and said second reference voltage input, and a capacitor coupled between said second reference voltage input and a first voltage rail, with said first resistor and capacitor forming an RC circuit having a time constant.

23. A clock distribution system according to claim 18, wherein:
said clock receiving means further comprises a first resistor and a first inductor coupled in series between a first output of said high speed comparator and said second reference voltage input, and a capacitor coupled between said second reference voltage input and a first voltage rail, with said first resistor, inductor, and capacitor forming an RLC circuit.

24. A clock distribution system according to claim 18, wherein:
said clock receiving means further comprises a first resistor and a first capacitor coupled in series between said unterminated clock transport means and said first input of said high speed comparator, a second resistor coupled between said first input of said high speed comparator and said second reference voltage input of said high speed comparator, and third and fourth resistors forming a voltage divider, with said third resistor coupled between a first voltage rail and said second reference voltage input, and said fourth resistor coupled between a second voltage rail and said third resistor.

25. A clock distribution system according to claim 1, wherein:
said sine wave generating and driving means generates and drives standing sine waves at a plurality of predetermined frequencies in said transport means.

26. A clock distribution system according to claim 25, wherein:
each said clock receiving means includes at least one filter means for dividing out said standing sine waves at a plurality of frequencies into separate signals at said clock receiving means.

27. A clock distribution system according to claim 26, wherein:
said sine wave generating and driving means comprises a summing means for summing a plurality of different frequency sine waves.

28. A clock distribution system according to claim 26, wherein:
said filter means comprises a plurality of pass-band filters, and a plurality of comparator means, with respective of said plurality of comparator means coupled to respective of said plurality of pass-band filters, wherein
each pass band filter passes a different of said plurality of frequencies to provide first clock signals, and each comparator means for comparing a first clock signal at a given frequency to a predetermined voltage and for generating a substantially distortion-free square wave at said given frequency.

29. A clock distribution system according to claim 25, further comprising:
phase locked loop means for coupling to and for providing phase feedback information to said sine wave generating and driving means in order to keep said standing sine waves at a plurality of predetermined frequencies in phase with each other, said phase locked loop means being coupled to said unterminated clock transport means at one of said plurality of nodes of said unterminated clock transport means.

30. A clock distribution system according to claim 29, wherein:

said sine wave generating and driving means includes a first sine wave generating means which generates a first sine wave of a first frequency and first phase, a second sine wave generating means which generates a second sine wave of a second frequency and second phase, a phase shifter means coupled to said second sine wave generating means and to said phase locked loop means for receiving said phase feedback information from said phase locked loop means and for shifting said second phase of said second sine wave so that it is in phase with said first phase of said first sine wave.

31. A clock distribution system according to claim 30, wherein:

said sine wave generating and driving means further includes summing means coupled to said first sine wave generating means and said phase shifter means for summing said first wave and second sine wave, said summing means being coupled to said unterminated clock transport means.

32. A clock distribution system according to claim 29, wherein:

said phase locked loop means comprises a filter means and a phase comparator means, said filter means having a plurality of pass-band filters and a plurality of comparator means, with respective of said plurality of comparator means coupled to respective of said plurality of pass-band filters, wherein each pass band filter passes a different of said plurality of frequencies to provide first feedback signals, and each comparator means for comparing its first feedback signal at a given frequency to a predetermined voltage and for generating a substantially distortion-free square wave at said given frequency, said phase comparator means for receiving said substantially distortion-free square waves, for comparing the phases of the square waves, and for providing a control output indicative of a phase difference between the phases of the square waves, said control output being provided as phase feedback information to said sine wave generating and driving means.

33. A clock distribution system according to claim 30, wherein:

said phase locked loop means comprises a filter means and a phase comparator means, said filter means having a plurality of pass-band filters and a plurality of comparator means, with respective of said plurality of comparator means coupled to respective of said plurality of pass-band filters, wherein each pass band filter passes a different of said plurality of frequencies to provide first feedback signals, and each comparator means for comparing its first feedback signal at a given frequency to a predetermined voltage and for generating a substantially distortion-free square wave at said given frequency, said phase comparator means for receiving said substantially distortion-free square waves, for comparing the phases of the square waves, and for providing a control output indicative of a phase difference between the phases of the square waves, said control output being provided as phase feedback information to said phase shifter means of said sine wave generating and driving means.

34. A clock distribution system for a digital synchronous system, where the clock distribution system provides both frequency and phase reference information, comprising:

a) first and second distribution circuits, each of said first and second distribution circuits having
  1) an unterminated clock transport means having at least one transmission line segment, each transmission line segment of said transport means being substantially loss-less at a predetermined frequency of interest, and each line segment having two nodes, wherein said unterminated clock transport means has a plurality of nodes, and
  2) at least one clock receiving means, each clock receiving means connected to one of said plurality of nodes of said unterminated clock transport means and presenting a substantially loss-less capacitive load at said predetermined frequency of interest to said unterminated clock transport means; and b) sine wave generating and driving means connected separately said first and second distribution circuits at one of said plurality of nodes of respective of said unterminated clock transport means of respective of said first and second distribution circuits, said sine wave generating and driving means for generating a standing sine wave at said predetermined frequency of interest in said transport means of said respective first and second distribution circuits, wherein each clock receiving means is for receiving said standing sine wave and determining frequency and phase reference information from said standing sine wave, wherein said standing sine wave crosses a voltage threshold at a crossing instance, and wherein the crossing instances of said standing sine wave at said plurality of nodes on said unterminated clock transport means of respective said first and second distribution circuits seen by each of said clock receiving means are substantially simultaneous.

35. A clock distribution system according to claim 34, wherein:

one of said first and second distribution circuits is a master, and the other is a slave, and said sine wave generating and driving means includes a sine wave generator which generates a sine wave of a first frequency and a first phase, said sine wave of a first frequency and a first phase being fed to said unterminated clock transport means of said master, and a phase adjustment means for adjusting said first phase of said sine wave of a first frequency and a first phase to produce a sine wave of said first frequency and of adjusted first phase, said sine wave of said first frequency and of adjusted first phase being fed to said unterminated clock transport means of said slave.

36. A clock distribution system according to claim 35, further comprising:

c) feedback means coupled to nodes of respective of said unterminated clock transport means, and to said phase adjustment means, said feedback means for adjusting said first phase of said sine wave generated by said sine wave generator.

37. A clock distribution system according to claim 36, wherein:

said feedback means comprises phase comparator means for comparing phases of signals at the nodes of respective of said unterminated clock transport means and for providing a control feedback signal to said phase adjustment means.

38. A clock distribution system according to claim 37, wherein:

said feedback means further comprises a first comparator means coupled to a node of said master distribution circuit for comparing the signal at the node to a predetermined voltage and for generating a first substantially distortion-free square wave therefrom, and a second comparator means coupled to a node of said slave distribution circuit for comparing the signal at the node to a predetermined voltage and for generating a second substantially distortion-free square wave therefrom, wherein first comparator means and said second comparator means are coupled to said phase comparator means and said first and second substantially distortion-free square waves are compared by said phase comparator means to provide said control feedback signal.

39. A clock distribution system according to claim 36, wherein:

said nodes to which said feedback means is coupled are the nodes to which said sine wave generating and driving means are connected.

40. A clock bus system for a digital backplane, comprising:

a) sine wave generating and driving means for generating a sinusoidal signal of substantially a single frequency, said frequency being a high frequency exceeding 1 MHz;

b) an unterminated clock bus coupled to said sine wave generating and driving means and receiving said sinusoidal signal wherein a substantially standing wave is generated on said clock bus by said sine wave generating and driving means, said unterminated clock bus having a plurality of nodes; and c) at least one clock receiving means coupled to said clock bus, each said clock receiving means having high impedance interface means such that each said clock receiving means presents a high impedance to said clock bus, wherein said standing sine wave crosses a voltage threshold at a crossing instance, and wherein the crossing instances of said standing sine wave at said plurality of nodes on said unterminated clock bus seen by each of said clock receiving means are substantially simultaneous.

41. A clock bus system according to claim 40, wherein:

said sine wave generating and driving means is located substantially at an electrical middle of said clock bus.

42. A clock bus system according to claim 41, wherein:

said sinusoidal signal has a first amplitude at a first of said plurality of nodes along said unterminated clock bus, and said sinusoidal signal at a second of said plurality of nodes second along said unterminated clock bus has a second amplitude within ±10% of said first amplitude.

\* \* \* \* \*

UNITED STATES PATENT AND TRADEMARK OFFICE
CERTIFICATE OF CORRECTION

PATENT NO. : 5,517,532
DATED : May 14, 1996
INVENTOR(S) : Welles Raymond

It is certified that error appears in the above-identified patent and that said Letters Patent is hereby corrected as shown below:

The title page, should be deleted to appear as per attached title page.

Signed and Sealed this

Fifth Day of November, 1996

*Attest:*

BRUCE LEHMAN

*Attesting Officer*        *Commissioner of Patents and Trademarks*

United States Patent [19]
Reymond

[11] Patent Number: 5,517,532
[45] Date of Patent: May 14, 1996

[54] STANDING SINE WAVE CLOCK BUS FOR CLOCK DISTRIBUTION SYSTEMS

[75] Inventor: Welles Reymond, Waterbury, Conn.

[73] Assignee: General DataComm, Inc., Middlebury, Conn.

[21] Appl. No.: 143,442

[22] Filed: Oct. 26, 1993

[51] Int. Cl.[6] ............................................. H04L 7/00
[52] U.S. Cl. .................. 375/354; 327/141; 327/144; 370/85.1; 370/100.1
[58] Field of Search ........................... 375/106, 110, 375/111, 113, 200, 203; 370/100.1, 85.1, 94.3; 364/721, 200; 327/141, 144, 145

[56] References Cited

U.S. PATENT DOCUMENTS

| | | | |
|---|---|---|---|
| 5,060,139 | 10/1991 | Theus | 364/200 |
| 5,105,340 | 4/1992 | Lawrence | 361/414 |
| 5,157,277 | 10/1992 | Tran et al. | 307/269 |
| 5,255,375 | 10/1993 | Crook et al. | 395/295 |
| 5,281,861 | 1/1994 | Tran et al. | 307/269 |

OTHER PUBLICATIONS

Kihara, "Performance Aspects of Reference Clock Distribution for Evolving Digital Networks", IEEE Comm. Mag. vol. 27, No. 4, Apr. 1989 pp. 24–36.

Hagelauer et al. "Investigations and Measurements of Dynamic Performance of High Speed ADCs", Instrumentation and Measurement Technology Conf. 1992.

*Primary Examiner*—Stephen Chin
*Assistant Examiner*—Bryan Webster
*Attorney, Agent, or Firm*—David P. Gordon

[57] ABSTRACT

A clock phase and frequency distribution system is disclosed which uses a standing sine wave and provides substantially simultaneous significant crossing instances everywhere in the system while using low power and not requiring bus termination or precise control of transmission path characteristics ($Z_0$). The system is particularly advantageous in high frequency applications such as digital, linear (non-branched), backplane applications, but is also applicable to other topographies such as stars, rings, and meshes. The system includes a sine wave generating and driving circuit, a clock bus, and clock receivers. The clock receivers present a high impedance interface to the clock bus. The basic design considerations and parameters which limit and define performance include the maximum propagation delay between any two points in the system, the total low frequency capacitance of the system, and the Q of the system which must be high at the frequency of the standing wave in order to satisfy low power and simultaneity objectives. To overcome system length limitations, embodiments utilizing master and slaves are provided, where phase feedback is provided to the slaves. Multifrequency systems are also provided.

42 Claims, 10 Drawing Sheets